United States Patent
Toy et al.

(10) Patent No.: US 7,138,821 B2
(45) Date of Patent: Nov. 21, 2006

(54) DIGITAL FILTER CIRCUIT AND METHOD FOR BLOCKING A TRANSMISSION LINE REFLECTION SIGNAL

(75) Inventors: Edmond Toy, Sunnyvale, CA (US); Klaas-Jan De Langen, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 245 days.

(21) Appl. No.: 10/610,274

(22) Filed: Jun. 30, 2003

(65) Prior Publication Data

US 2005/0088962 A1    Apr. 28, 2005

Related U.S. Application Data

(60) Provisional application No. 60/427,411, filed on Nov. 18, 2002.

(51) Int. Cl.
    *H03K 17/16* (2006.01)
(52) U.S. Cl. .......................................... 326/30; 327/321
(58) Field of Classification Search ................. 326/30; 327/170, 312, 321, 328
    See application file for complete search history.

(56) References Cited

U.S. PATENT DOCUMENTS

| | | | | |
|---|---|---|---|---|
| 4,498,021 A | * | 2/1985 | Uya | .............................. 326/86 |
| 4,943,739 A | | 7/1990 | Slaughter | ..................... 307/443 |
| 5,227,677 A | | 7/1993 | Furman | ....................... 307/443 |
| 5,949,825 A | * | 9/1999 | Naffziger | ..................... 375/257 |
| 6,160,416 A | * | 12/2000 | Adduci et al. | ................. 326/21 |

* cited by examiner

*Primary Examiner*—Daniel D. Chang
(74) *Attorney, Agent, or Firm*—Kevin Fortin (57) ABSTRACT

A digital blocking filter and filtering method are provided for a device receiving signals from a transmission line. The transmission line, which may comprise part of a complex bus system, is incompletely terminated, thereby resulting in a reflection signal within the line with transmission of a signal. The digital blocking filter includes a pulse generator for generating a masking pulse timed and of sufficient duration to substantially block at the device the reflection signal, and logic for combining the masking pulse and a received signal from the transmission line, thereby substantially blocking the reflection signal. Circuitry for handling reflection signals of various duration, as well as for substantially blocking a reflection signal on either a falling edge or a rising edge of a state change in the received signal are provided.

6 Claims, 11 Drawing Sheets fig. 1

DIGITAL FILTER CIRCUIT AND METHOD FOR BLOCKING A TRANSMISSION LINE REFLECTION SIGNAL

REFERENCE TO RELATED APPLICATION

This application claims the benefit of U.S. Provisional Application No. 60/427,411, filed Nov. 18, 2002. This provisional application is hereby incorporated by reference herein in its entirety.

FIELD OF THE INVENTION

The present invention relates in general to transmission line terminators, and more particularly, to a digital filter circuit and method for blocking transmission line reflection signals arising from an incomplete termination impedance being coupled to an end of the transmission line.

BACKGROUND OF THE INVENTION

In order to properly transmit data in a network, reflection signals on the transmission lines of the network need to be managed. Reflection signals are typically avoided by terminating a transmission line at both its input and output with the line's characteristic impedance. One disadvantage of using termination of both transmission line ends, however, is the amount of power that is consumed by the termination resistors.

SUMMARY OF THE INVENTION

The shortcomings of the prior art are overcome and additional advantages are provided through the provision of a blocking filter for a device receiving signals from a transmission line. The blocking filter includes a pulse generator for generating a masking pulse timed and of sufficient duration to block at the device a reflection signal within a received signal from the transmission line, wherein the reflection signal results from incomplete termination of the transmission line. The filter further includes logic for combining the masking pulse with the received signal, such that the reflection signal is blocked by the masking pulse at the blocking filter.

In another aspect, a network is provided which includes a bus system having a transmission line which is incompletely terminated, wherein a reflection signal arises with transmission of a signal across the transmission line. The network further includes a device connected to the transmission line for receiving the signal. The device includes a blocking filter having a pulse generator for generating a masking pulse timed and of sufficient duration to block at the device the reflection signal, and logic for combining the masking pulse with the signal received from the transmission line, wherein the reflection signal is blocked by the masking pulse.

In a further aspect, a method of filtering received signals from a transmission line is provided. The method includes: generating a masking pulse timed and of sufficient duration to block at a device connected to the transmission line a reflection signal within the received signal from the transmission line, the reflection signal resulting from incomplete termination of the transmission line; and combining the masking pulse with the received signal, wherein the reflection signal is blocked by the masking pulse.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF EMBODIMENTS

Figure 1:
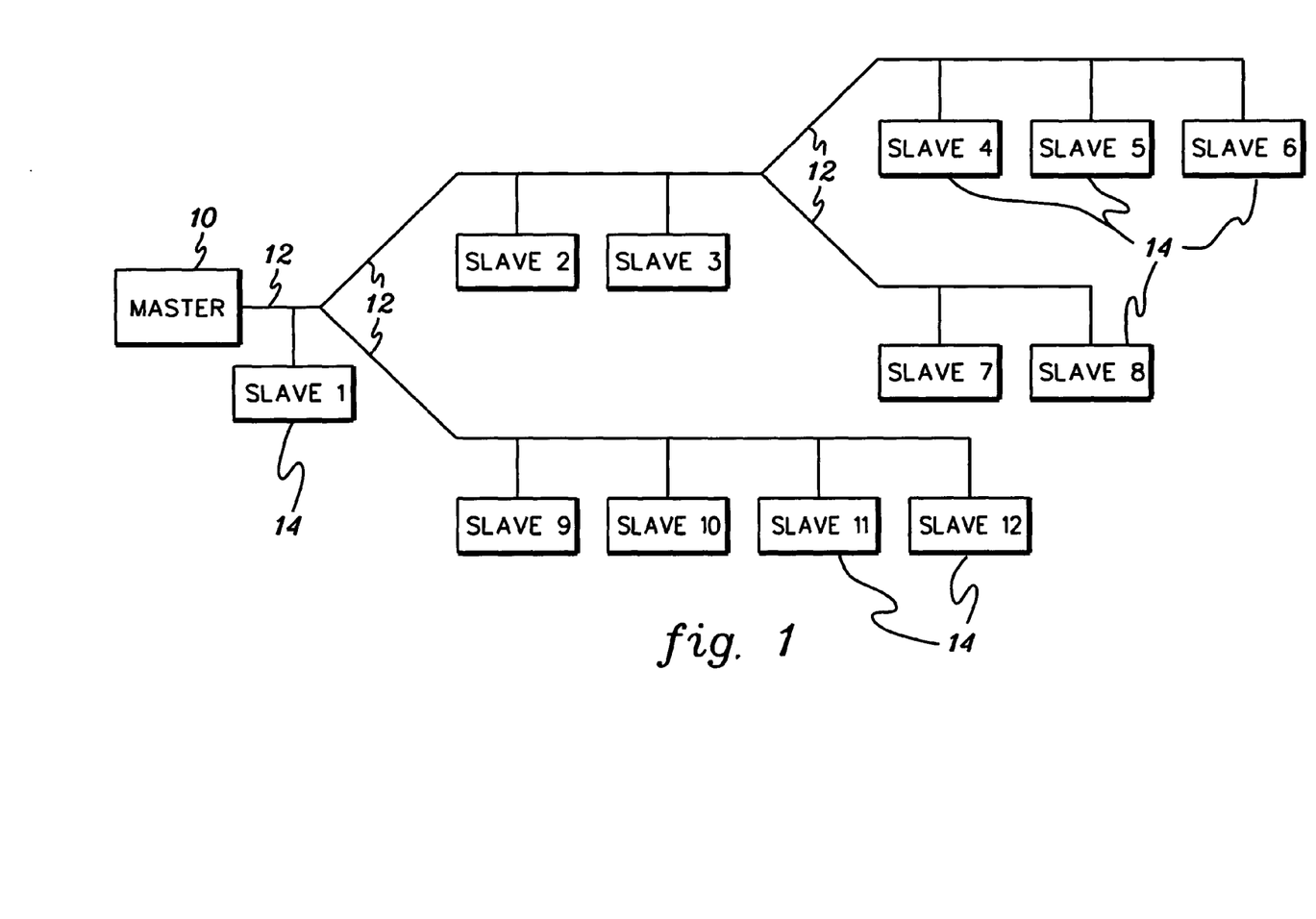
FIG. 1 is an example of a complex network topology within which transmission line reflection signal filtering can be employed, in accordance with an aspect of the present invention.

One problem in applying termination resistors to the ends of network transmission lines arises in complex networks such as depicted in FIG. 1. In FIG. 1 a master device 10, such as a computer, may drive signals across transmission lines 12 to a plurality of slaves 14, in this example, slave 1 through slave 12. Each slave in the network topology of FIG. 1 comprises, for example, a sensor or actuator. In view of the complexity of the network topology, it may be difficult to correctly apply termination at the ends of the transmission lines because a particular line may have multiple ends, and certain slave devices should terminate the line, while most slave devices should not.

Figure 2:
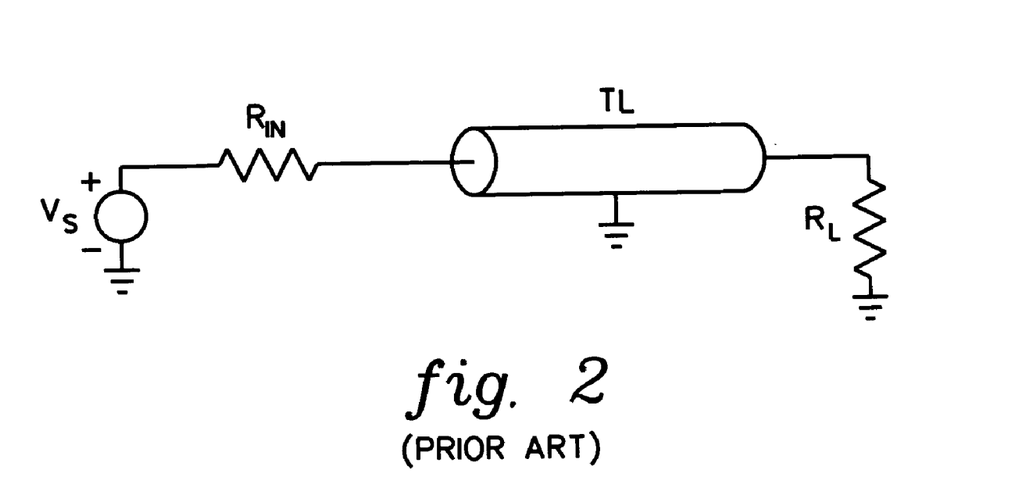
FIG. 2 is a schematic of an approach for operating a transmission line with termination resistors at the input end and output end of the line.

The conventional technique for driving and terminating a transmission line is shown schematically in FIG. 2. In this example, the transmission line TL is driven by a source signal $V_S$ and the line is terminated at the input by resistor $R_{IN}$ as well at the output by resistor $R_L$. If the value of both resistors is equal to the characteristic impedance $Z_O$ of the transmission line, no reflections occur and high speed data communications is possible. As noted, however, a problem with this approach is the power that is dissipated in the termination resistors. This problem can be solved, in part, by connecting load resistor $R_L$ to a latch instead of to ground connection so that no static power is dissipated. This solution, however, does not address the problem of how to insert termination resistors in a complex system such as depicted in FIG. 1.

Figure 3:
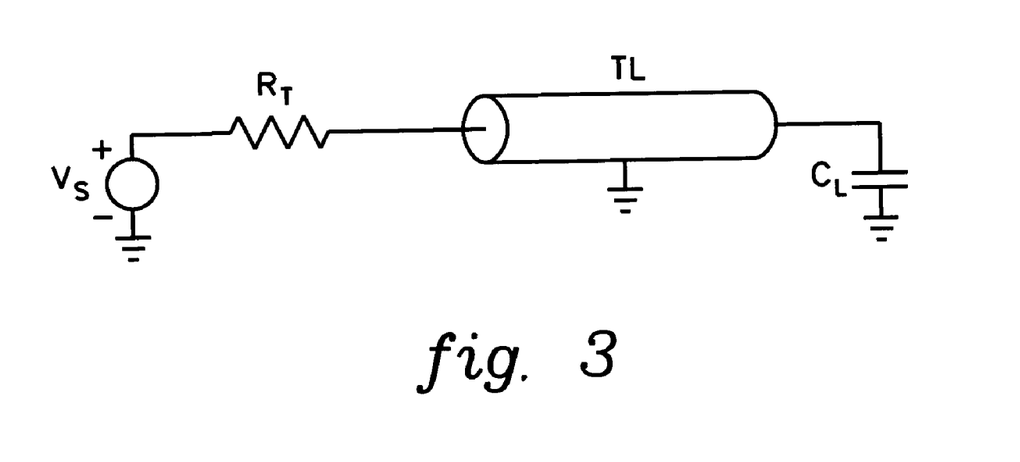
FIG. 3 is an alternate embodiment for operating a transmission line with the termination resistor at the output end of the line removed and only capacitive loading remaining.

When resistive termination at the output end of a transmission line is omitted, or cannot be used, the transmission line can be represented by the schematic depicted in FIG. 3. In this example, transmission line TL is driven by voltage $V_S$ and input termination resistor $R_T$. The capacitive load $C_L$ at the output represents the loading of the slave devices. When the input voltage falls from voltage V down to zero, the waveforms shown in FIG. 4 can be found at the input end of the transmission line and the waveforms plotted in FIG. 5 can be found at the output end of the transmission line. These waveforms are shown for different values of termination resistance $R_T$. For the case where the termination resistance is equal to the characteristic impedance $Z_O$ of the transmission line, the output voltage displays an exponential decay determined by $R_T$ and $C_L$ after an initial delay caused by the time the signal needs to go from the input to the output of the line. At the input end of the line, the voltage immediately drops to one-half V because of the voltage division between $R_T$ and the characteristic impedance of the transmission line. After a delay equal to two times the time needed for a signal to travel the length of the transmission line, a reflection caused by the capacitor load at the output end of the transmission line returns to the input. This reflection causes the input line voltage to spike (e.g., return to voltage V), before dissipating into the input end termination resistor. Thereafter, the input voltage decays exponentially. For lower values of $R_T$ more reflections occur, but the signal settles much faster to the final value. Therefore, it may be advantageous to apply a termination resistor at the input end that is lower than the characteristic impedance $Z_O$.

Figure 4:
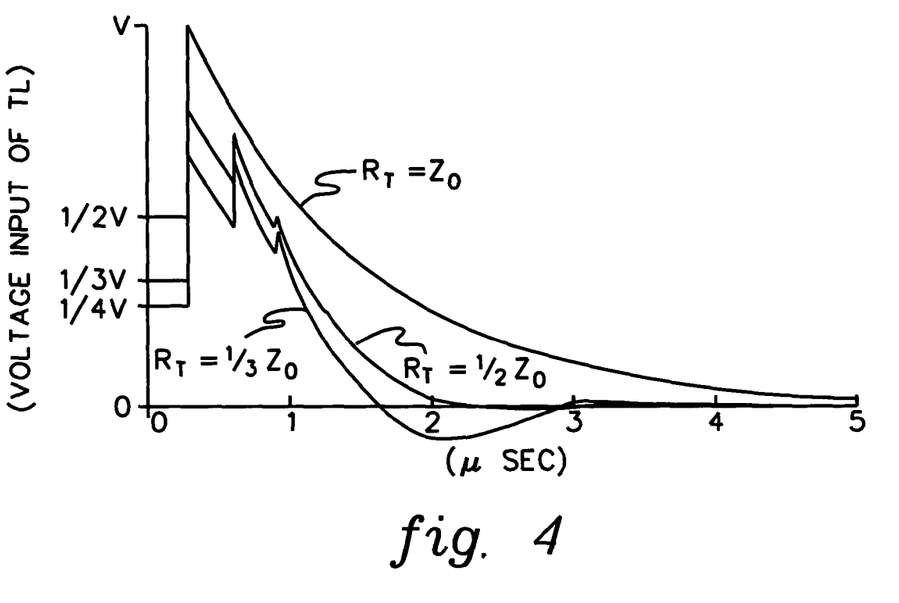
FIG. 4 graphically represents a signal at the input end of the transmission line of FIG. 3 for different values of input termination resistance as signal voltage falls from voltage V to ground.
Figure 5:
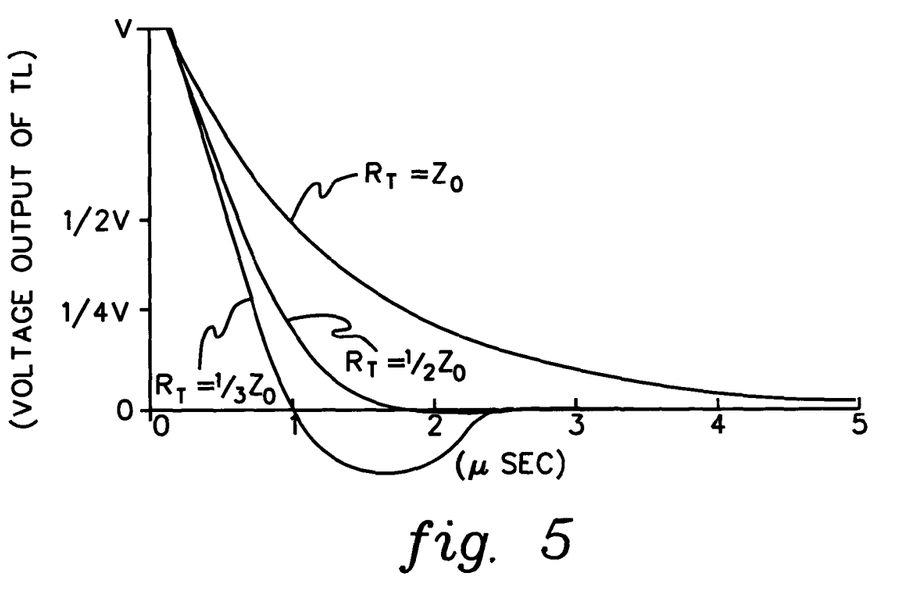
FIG. 5 graphically represents the signal at the output end of the transmission line of FIG. 3 for different values of input termination resistance as signal voltage falls from voltage V to ground.
Figure 6:
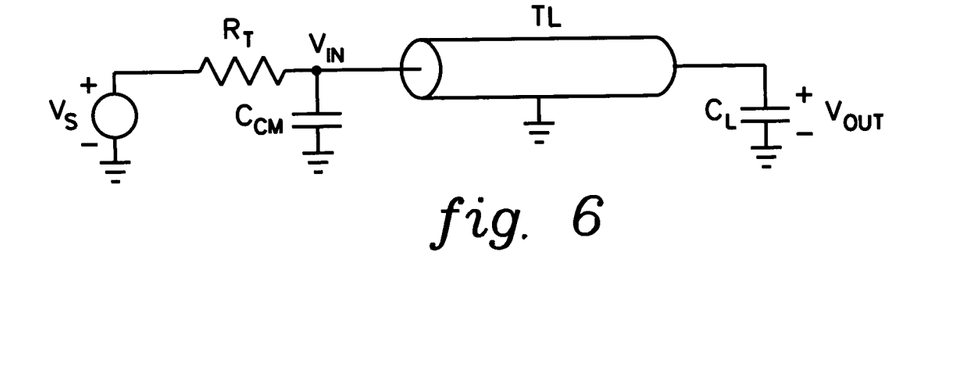
FIG. 6 depicts another embodiment of a transmission line operated with a termination resistance at the input end and capacitive loading at the output end, and having a capacitance at the input end modeling the capacitance of a common mode filter at the input of the line.
Figure 7:
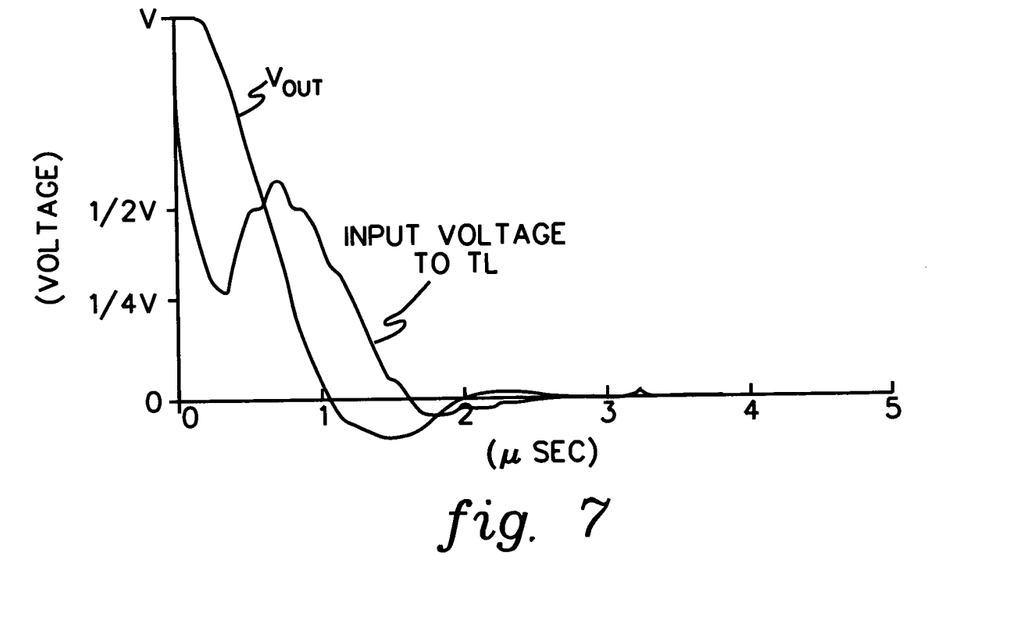
FIG. 7 graphically depicts voltage input and voltage output signals for the transmission line depicted in FIG. 6, with a signal state change from voltage V to ground occurring.

FIG. 6 depicts another model of a transmission line or bus system. In this schematic, capacitor $C_{CM}$ is added to model the capacitance of a common-mode filter connected between the output of a transmitting device and the input of the transmission line (see FIG. 1). Exemplary falling edge induced signals at the input end and output end of the transmission line are plotted in FIG. 7. These signals are similar to the signals depicted in FIGS. 4 & 5, but the sharp reflections of FIG. 4 are reduced by capacitor $C_{CM}$. The result is a reflection bump at the input end of the transmission line. In the middle of the line, a signal occurs that has a shape that is in between the shape of the input and output transmission line signals of FIG. 7, yielding a smaller reflection signal. Thus, in a complex system such as depicted in FIG. 1, the slave nodes near the input end of a transmission line may see an extra digital pulse, which could affect the device's performance. For example, if a device is using the received signal to drive a clock, an additional clock pulse might be incorrectly sensed due to the reflection signal. A goal of the present invention is to substantially block these reflection signals or bumps, to the extent received at a device (e.g., slaves connected to the transmission line).

Figure 8:
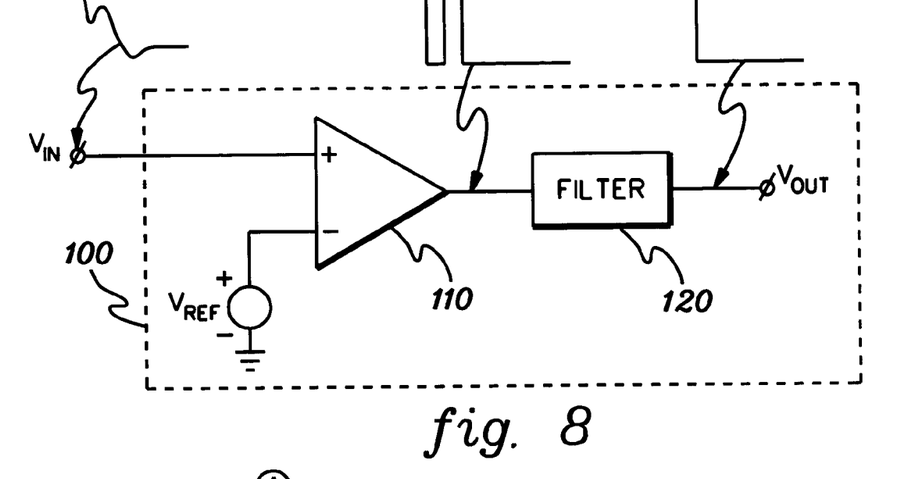
FIG. 8 is a high level, partial schematic of a receiver device with a blocking filter for handling a transmission line reflection signal, in accordance with an aspect of the present invention.
Figure 10:
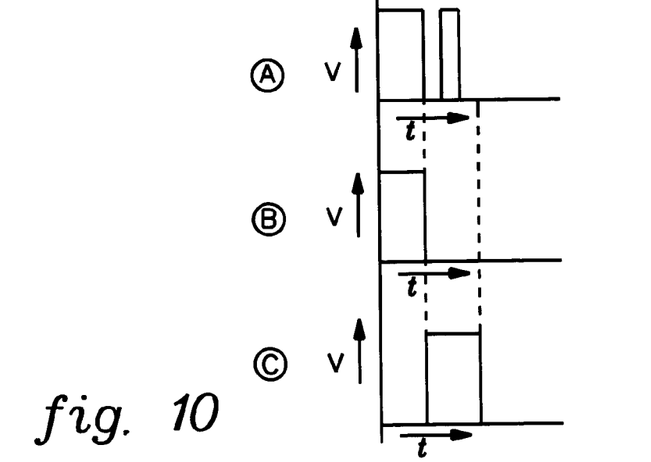
FIG. 10 graphically illustrates a received voltage signal (A), a desired output voltage signal (B) and a masking voltage signal (C) occurring within the blocking filter of FIG. 9, in accordance with an aspect of the present invention.

FIG. 8 depicts one embodiment of a device or receiver 100 which includes a blocking filter 120 for removing a received reflection signal. Receiver 100 includes a comparator 110, which compares the received bus voltage ($V_{IN}$) to a reference voltage ($V_{REF}$). The output of comparator 110 changes when the bus voltage passes the reference voltage. Responsive to the reflection signal or bump, an additional pulse may be generated at the output of comparator 110 as shown in FIG. 10 (See Signal (A)) with falling of the received signal to ground. When the reference voltage is close to the voltage of the reflection signal, this additional pulse may corrupt the logic of the receiving circuit, particularly when the receiver employs the received signal to extract a clock signal. Therefore, blocking filter 120 is presented to suppress any additional pulse which may be produced from a reflection signal on either a falling or rising edge of the received signal.

One possibility for suppressing the reflection signal would be to use a filter such as an RC filter. The drawback of such a filter, however, is that delay is introduced. This delay can be avoided by the use of a filter (such as described herein) which allows the initial signal edge transition to pass, but blocks the additional reflection pulse. One embodiment of such a circuit is depicted in FIG. 9, with signals at various nodes of the circuit being shown in FIG. 10 responsive to the received voltage ($V_{IN}$) falling from voltage V to ground.

Figure 9:
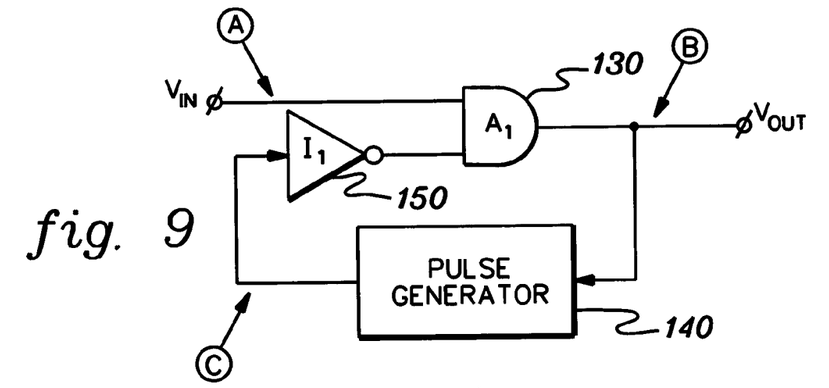
FIG. 9 is a schematic of one embodiment of a blocking filter for the receiver of FIG. 8, in accordance with an aspect of the present invention.

The filter circuit of FIG. 9 includes an AND gate 130 which receives as input the received voltage signal ($V_{IN}$) from the transmission line, and outputs therefrom a voltage ($V_{out}$) to be employed by the receiver (e.g., master or slave device). A second input to AND gate 130 is received from an inverter 150, which is driven by output from a pulse generator 140. Generator 140 is driven by the output of AND gate 130. Initially, the output of pulse generator 140 is low so that inverter 150 presents a high signal to AND gate 130. Therefore, the output signal $V_{out}$ is identical to the input signal $V_{IN}$ and the initial falling edge of the input signal is immediately present at the output. This falling edge at the output starts the pulse generator. The pulse created by the pulse generator is inverted by inverter 150 so that a low signal is presented to AND gate 130. Consequently, the output voltage $V_{out}$ remains low responsive to the masking pulse of the pulse generator, and the reflection pulse presented at the input $V_{IN}$ is blocked. This is shown graphically in FIG. 10, wherein an initial falling edge in received signal ($V_{IN}$) is depicted in graph (A), the output signal ($V_{out}$) is depicted in graph (B), and the masking signal is depicted in graph (C).

Figure 11:
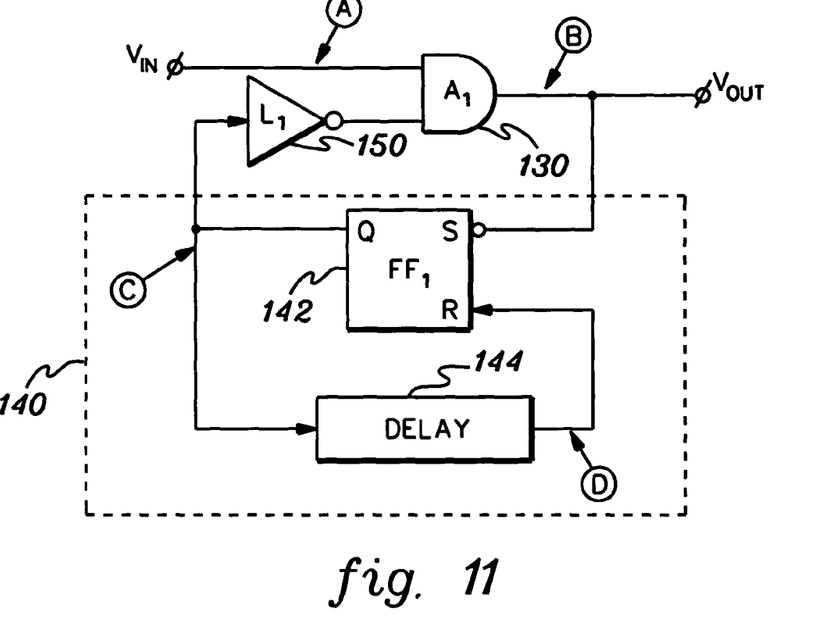
FIG. 11 depicts another embodiment of a blocking filter showing one embodiment of the pulse generator of FIG. 9, in accordance with an aspect of the present invention.

FIG. 11 illustrates one embodiment of pulse generator 140 for the blocking filter, which includes the same AND gate 130 and inverter 150 as depicted in FIG. 9. Pulse generator 140 is implemented (in this embodiment) by a memory element 142 (i.e., flip flop $FF_1$) and a delay circuit 144. Memory element 142 is set by the falling edge of output signal $V_{out}$ (see graph (B) of FIG. 12), and output Q of element 142 goes high (see graph (C) of FIG. 12) and drives inverter 150 and AND gate 130 in such a way that a reflection pulse derived from the received signal ($V_{IN}$) (see graph (A) of FIG. 12) is blocked. The output of element 142 also drives a delay circuit 144. After a certain delay, the output of delay circuit 144 (see graph (D) of FIG. 12) goes high and memory element 142 is reset. Consequently, the output of element 142 is low and the received signal ($V_{IN}$) controls the output signal ($V_{out}$) again. Also, the delay circuit 144 is reset so that its output goes low and the circuit is again ready for blocking a reflection after a next falling edge.

Figure 12:
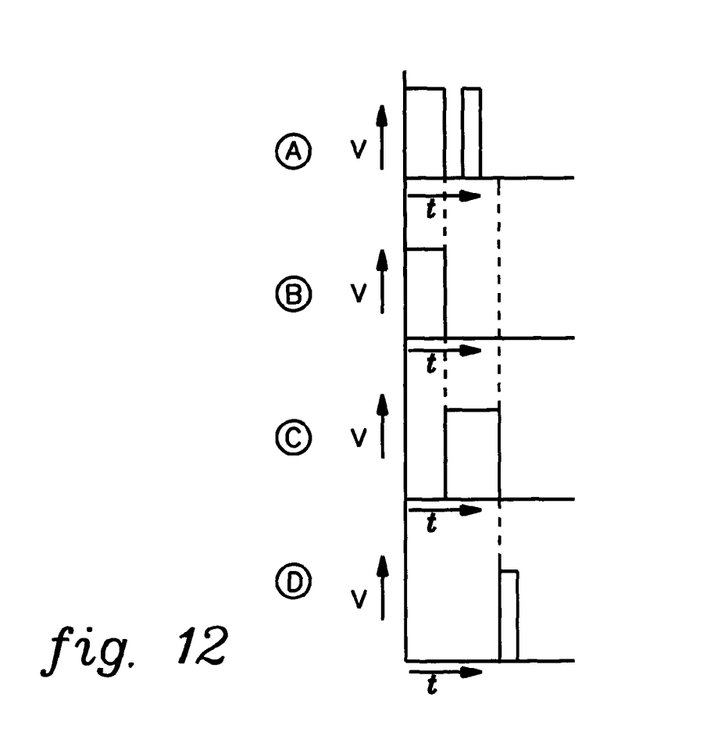
FIG. 12 graphically illustrates a received voltage signal (A), a desired voltage out signal (B), a masking signal (C), and a delayed reset signal (D) occurring within the blocking filter of FIG. 1, in accordance with an aspect of the present invention.
Figure 13:
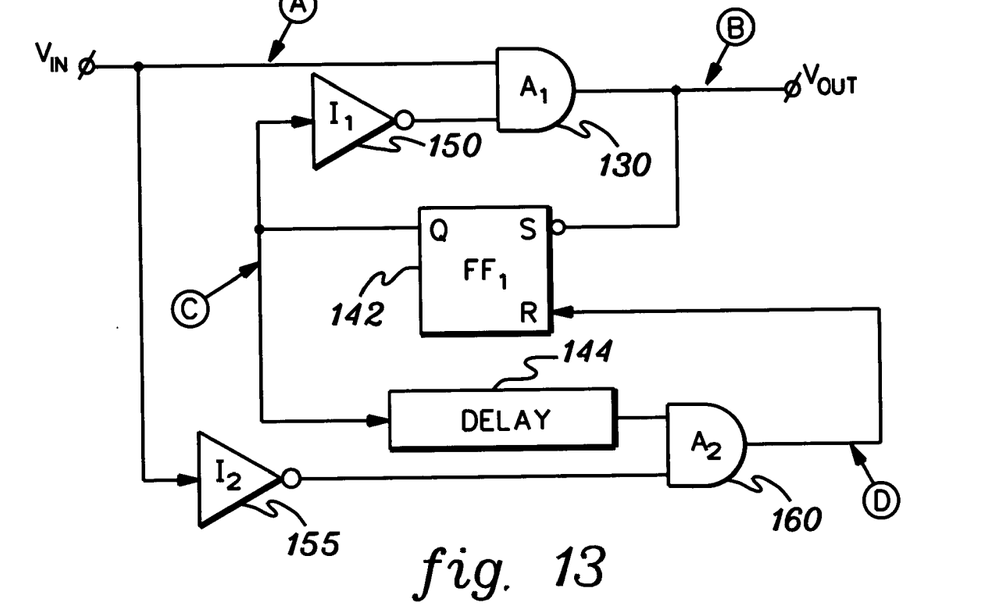
FIG. 13 depicts another embodiment of a blocking filter, which allows part of the reflection signal to be outside of the masking signal while still blocking the reflection signal, in accordance with an aspect of the present invention.
Figure 14:
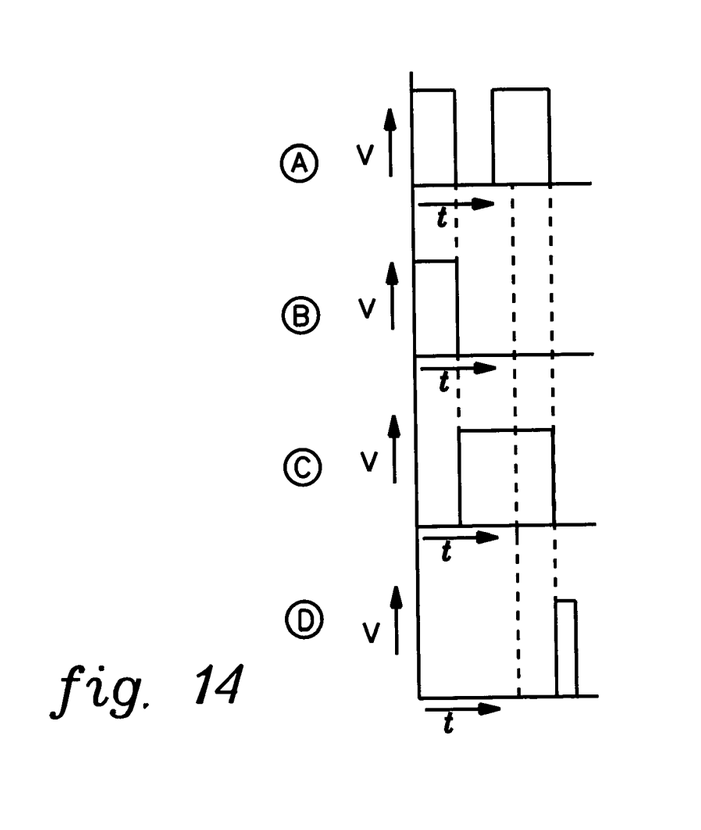
FIG. 14 graphically illustrates a received voltage signal (A), a desired voltage out signal (B), a masking signal (C), and an extended delayed reset signal (D) for the circuit of FIG. 13, in accordance with an aspect of the present invention.

When the reflection pulse at the received signal ($V_{IN}$) does not completely fall within the time delay set by the pulse generator, such as depicted in FIG. 14 (compare graph (A) of FIG. 12 and graph (A) of FIG. 14), the filter circuit of FIG. 11 might still generate an additional reflection pulse at the output $V_{out}$ (which has the undesired effect of making $V_{out}$ look like $V_{IN}$). This possibility can be avoided by increasing the duration of the blocking pulse, but this also increases the risk of missing the next rising edge of the received input signal. Another solution, employing logic for lengthening the masking pulse, is depicted in FIG. 13. In this circuit, the reset pulse generated by delay circuit 144 is blocked as long as the input signal is high using a second inverter $I_2$ 155 and AND gate $A_2$ 160 (see graph (D) of FIG. 14). Thus, the reset is delayed or extended to as long as the additional reflection pulse lasts. A slight disadvantage of this approach is that the reset of the delay circuit is delayed which might be a problem when the delay circuit is used for blocking rising-edge pulses as well as for blocking falling-edge pulses (described further below).

Figure 15:
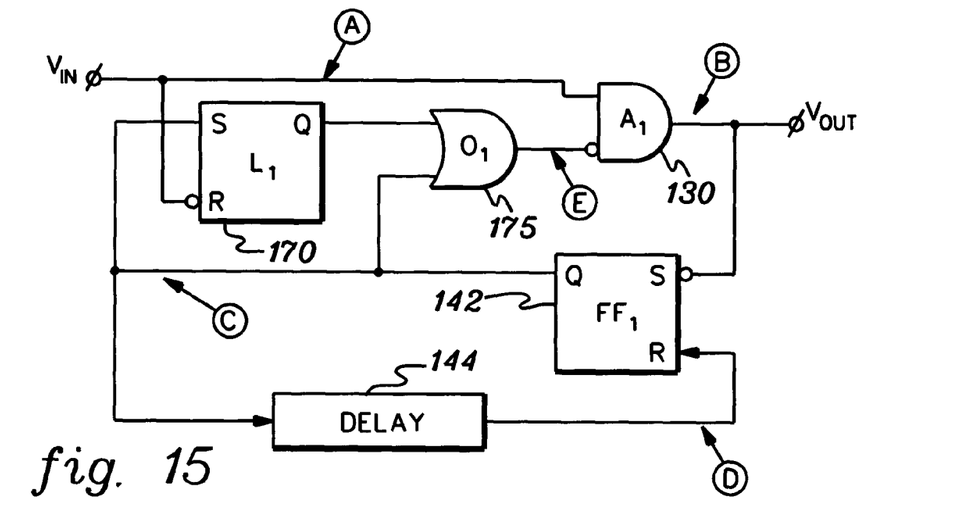
FIG. 15 depicts another embodiment of a blocking filter, which again allows part of the reflection signal to be outside of the masking signal, and which has fast reset of the delay circuit, in accordance with an aspect of the present invention.
Figure 16:
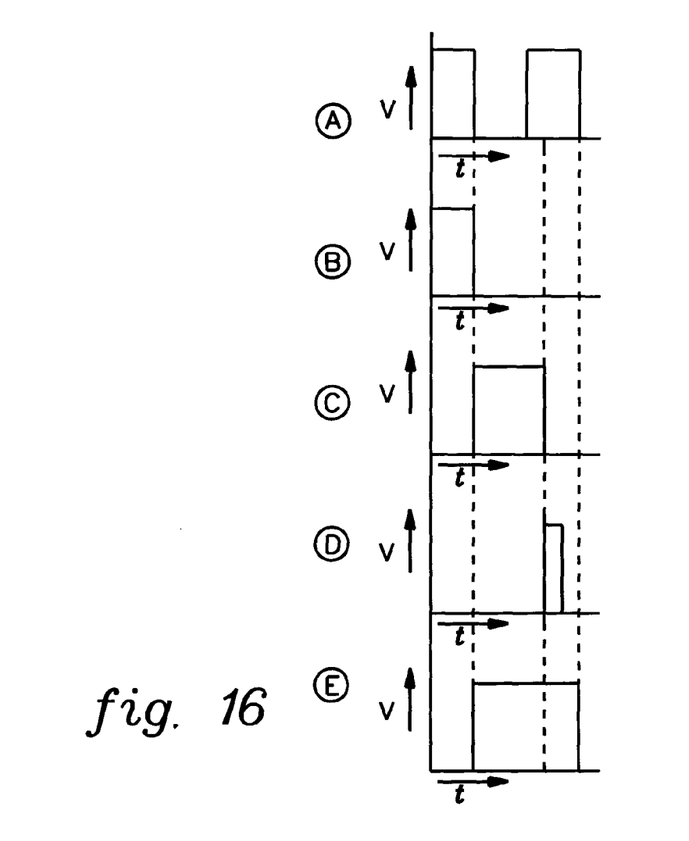
FIG. 16 graphically illustrates voltage signals using the circuit of FIG. 15, including a received voltage signal (A), a desired voltage out signal (B), a masking signal (C), a delayed reset signal (D), and an extended masking signal (E), in accordance with an aspect of the present invention.

FIG. 15 depicts still another filter circuit embodiment in accordance with an aspect of the present invention. This circuit again uses the same pulse generator as the circuit shown in FIG. 11 so that resetting of the delay circuit is not delayed. A second memory element, latch $L_1$ 170, is used to stretch or extend the masking pulse (see graph (E) of FIG. 16). Latch $L_1$ 170 is set when the masking pulse and the received input voltage ($V_{IN}$) are high. Latch $L_1$ 170 is reset when both the masking pulse and the received voltage signal are low. The output of the pulse generator (i.e., output Q from memory element 142) and the output of the latch 170 are combined by an OR gate $O_1$ 175. Thus, the output of OR gate 175 goes high on the falling edge of the received voltage signal ($V_{IN}$) and stays high until both the masking pulse and the received voltage signal have returned to a low state. FIG. 16 graphically depicts this. Graph (A) of FIG. 16 represents the received voltage signal ($V_{IN}$), which as shown has a second wide reflection signal on the falling edge of the actual voltage signal. Graph (B) of FIG. 16 represents the desired output voltage ($V_{out}$), while graph (C) represents the initial masking pulse output by the pulse generator. Graph (D) of FIG. 16 represents the delayed reset pulse for FF1 generated by the delay circuit 144 of the pulse generator, and graph (E) represents the extended masking performed by latch 170 and OR gate 175. As shown, the reflection signal in the received signal (A) is fully masked by the extended masking pulse (E).

Figure 17:
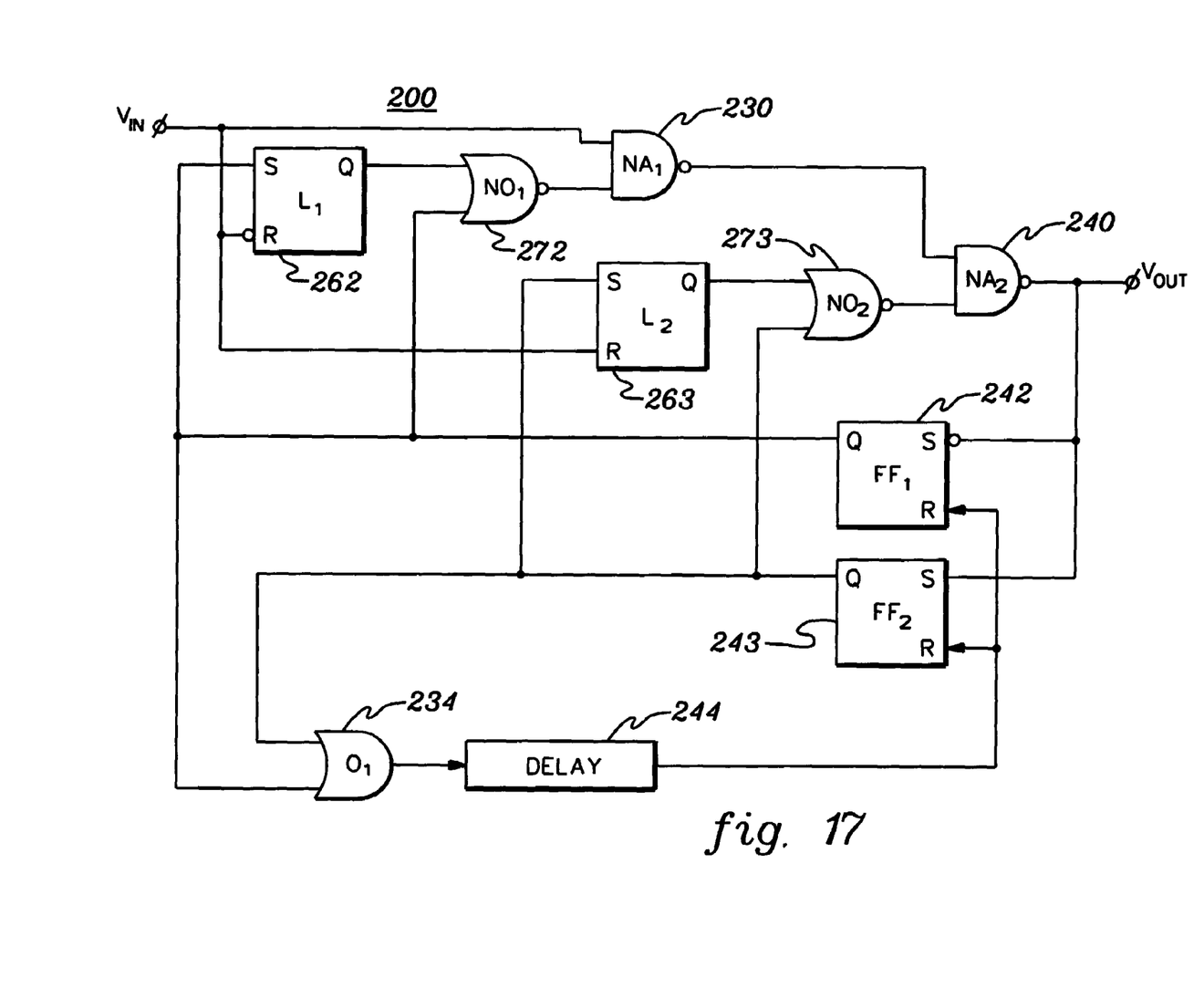
FIG. 17 is a schematic of one embodiment of a blocking filter for blocking both falling and rising edge reflection signals, in accordance with an aspect of the present invention.

The circuit of FIG. 15 can be extended so that reflection pulses on both the rising edge and the falling edge of the received signal can be blocked. One example of such a circuit, generally denoted 200, is depicted in FIG. 17. Initially, the lower inputs to NAND gates 230 and 240 are high so that the output voltage $V_{out}$ is identical to the input voltage. At the falling edge of the output voltage, memory element 242 is set while the rising edge of the output voltage sets memory element 243. The output of memory elements 242 & 243 are combined by OR gate 234, which starts the delay circuit 244. Thus, on both the falling and the rising edge, the same delay circuit is started. After a certain time, the delay circuit resets memory elements 242 and 243. The result is a masking pulse at the output of memory element 242 after each falling edge and a masking pulse at the output of element 243 after each rising edge.

The output of memory element 242 is extended by latch $L_1$ 262 and NOR gate $NO_1$ 272 until the input image goes low. The NOR gate drives NAND gate 230 to keep the output low during the extended masking pulse. The output of memory element 243 is extended by latch $L_2$ 263 and NOR gate $NO_2$ 273 until the actual received voltage input signal goes high. The NOR gate drives NAND gate 240 to keep the output high during the extended masking pulse.

Figure 18:
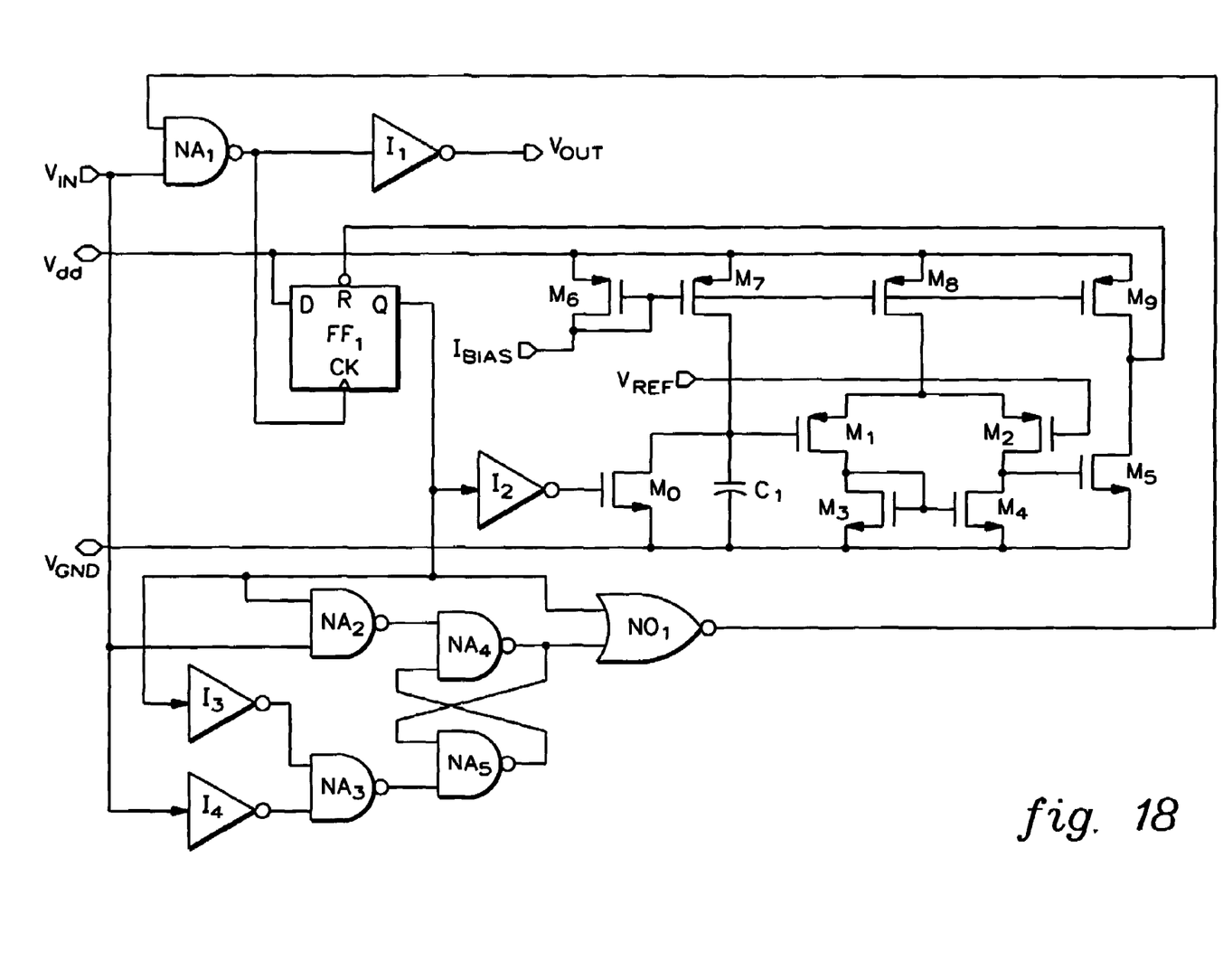
FIG. 18 is a schematic of one detailed embodiment of the blocking filter of FIG. 15, in accordance with the aspect of the present invention.

FIG. 18 illustrates one detailed implementation of the circuitry of FIG. 15. In this example, the AND gate $A_1$ shown in FIG. 15 is replaced by NAND gate $NA_1$ and an inverter $I_1$. Flip flop $FF_1$ in FIG. 15 is implemented by D-flip flop $FF_1$ in FIG. 18. The delay circuit can be implemented using a digital counter, however, in this case an analog circuit consisting of transistors $M_0$–$M_9$ and capacitor $C_1$ is used. The latch $L_1$ shown in FIG. 15 is created using NAND gates $NA_2$–$NA_5$ and inverters $I_3$ and $I_4$. Initially, the upper input of NAND gate $NA_1$ is high and the input voltage is inverted by $NA_1$ and inverter $I_1$ so that the output voltage is identical to the input voltage. At the falling edge of the input voltage, flip flop $FF_1$ is clocked so that its Q output becomes high responsive to the rising edge of the input clock. Consequently, the input of inverter $I_2$ is high, the output of inverter $I_2$ is low and transistor $M_0$ is turned off so that current source $M_7$ starts to charge capacitor $C_1$. After a certain time, the voltage across capacitor C, is larger than the reference voltage $V_{REF}$ and the output of the comparator (comprising differential stage $M_1$, $M_2$, current mirror $M_3$, $M_4$ and output stage $M_5$) goes low. As a result, flip flop $FF_1$ is reset and its output Q is low. Therefore, transistor $M_0$ is turned on by inverter $I_2$ and the capacitor is discharged so that the delay circuit is ready for the next pulse. When the output of flip flop $FF_1$ is high, the output of NOR gate $NO_1$ is low and NAND gate $NA_1$ blocks the input voltage. The blocking pulse at the output of flip flop $FF_1$ also sets the latch when the input voltage returns to the high state: if both the input voltage $V_{IN}$ and the output voltage of flip flop $FF_1$ are high, the output of $NA_2$ is low, while the inverters $I_3$ and $I_4$ drive the inputs of $NA_3$ with a low signal so that the output of $NA_3$ is high. This situation sets the latching structure $NA_4$, $NA_5$, yielding a high voltage at the output of $NA_4$ and at the lower input of $NO_1$, so that the blocking pulse is extended as long as the latch is set. When the blocking pulse generated by $FF_1$ is low and also the input voltage is low, the output of $NA_2$ is high and the output of $NA_3$ is low resulting in resetting of the latching structure, driving the output of $NA_4$ low. As a result, the output of $NO_1$ goes high and the output voltage is again identical to the input voltage.

Figure 19:
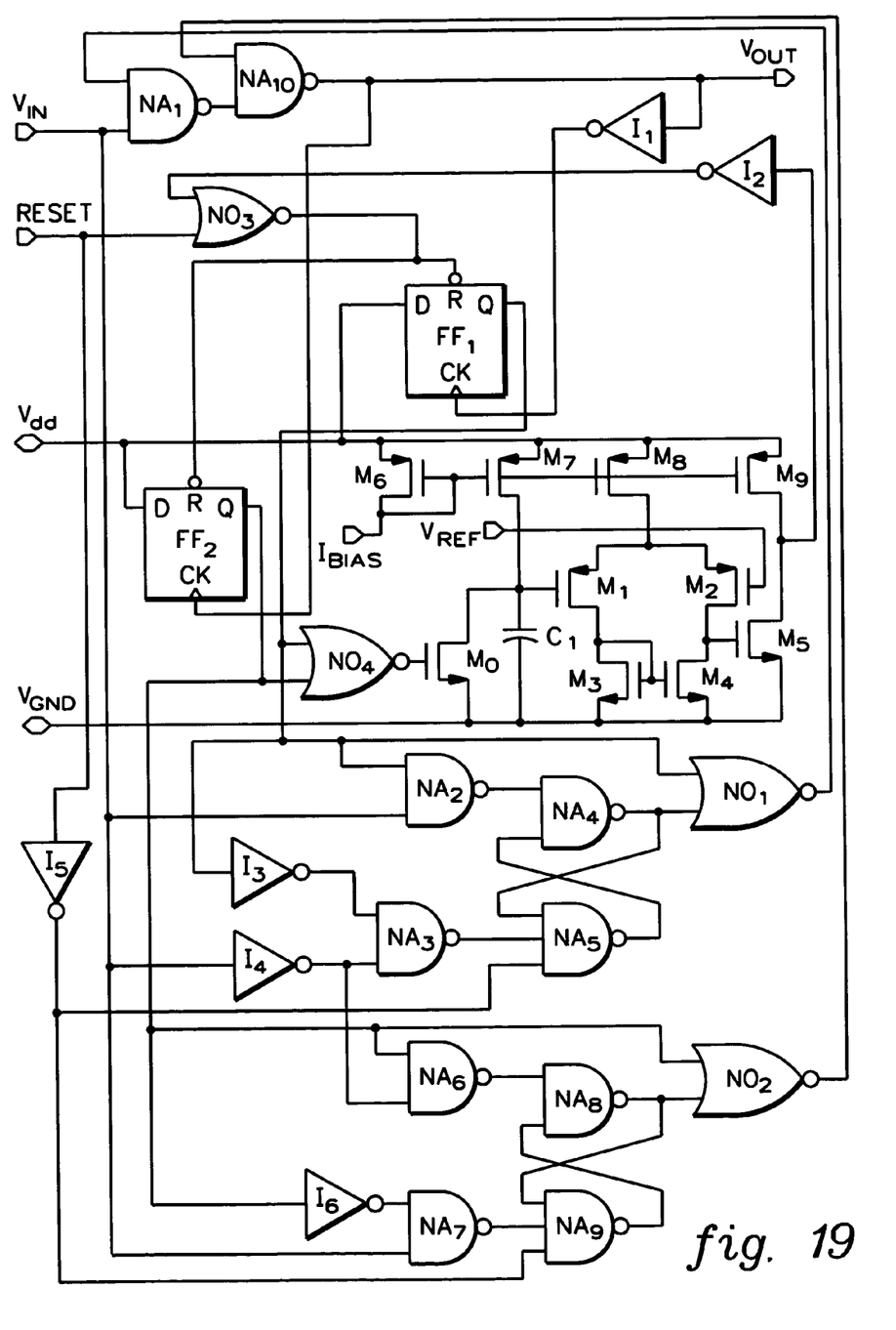
FIG. 19 is a schematic of one detailed embodiment of the blocking filter of FIG. 17, in accordance with an aspect of the present invention.

A detailed implementation of the pulse-blocking filter for rising and falling edges is depicted in FIG. 19. This implementation is based on the principle presented in FIG. 17. Initially, the upper inputs of NAND gates $NA_1$ and $NA_{10}$ are high so that the output voltage $V_{out}$ is identical to the input voltage $V_{IN}$. Flip flop $FF_1$ is clocked by the falling edge of the output signal $V_{out}$ via inverter $I_1$. Flip flop $FF_2$ is clocked by the rising edge of the output signal $V_{out}$. The output of both flip flops is combined by NOR gate $NO_4$ in order to trigger the delay circuit on the rising edge as well as on the falling edge of $V_{out}$. The output of the delay circuit drives the reset of the flip flops via inverter $I_2$ and NOR gate $NO_3$. The latch consisting of NAND gates $NA_2$—$NA_5$ and inverters $I_3$ and $I_4$ together with NOR gate $NO_1$ extends the falling-edge blocking pulse until the input signal is low. The latch comprising NAND gates $NA_6$–$NA_9$ and inverters $I_4$ and $I_6$ together with NOR gate $NO_2$ extends the rising-edge blocking pulse until the input signal is high. The input signal RESET resets the flip flops $FF_1$ and $FF_2$ via NOR gate $NO_3$ and it also resets the latches via inverter $I_5$ using additional inputs on NAND gates $NA_5$ and $NA_9$.

To summarize, conventional matching impedance termination at the output of transmission lines may be impractical in complex bus systems. Without full termination, however, a reflection signal or pulse can occur on the bus creating additional pulses at the input of the receiving devices. Reflection blocking filters are presented herein to substantially suppress these additional reflection pulses without adding delay to the received signal.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A circuit comprising:
a pulse generator capable of generating a masking pulse timed and of sufficient duration to block at a device a reflection signal within a received signal from a transmission line;
logic for combining the masking pulse with the received signal, wherein the reflection signal is substantially blocked by the masking pulse at a blocking filter; and
wherein the pulse generator comprises at least one memory element and a delay circuit, wherein an inverted output of the logic drives a set input of the at least one memory element, an output of the delay circuit drives a reset input of the at least one memory element, and an output of the at least one memory element is inverted and provided as input to the logic as the masking pulse.

2. The circuit of claim 1, wherein the transmission line has mismatched impedance termination at an output end thereof.

3. The circuit of claim 1, wherein the device is a receiver device which is connected closer to an input end of the transmission line than an output end of the transmission line.

4. The circuit of claim 1, wherein the blocking filter comprises a digital filter circuit disposed at an input of the device.

5. A network comprising:
a bus system having a transmission line, wherein a reflection signal arises with transmission of a signal across the transmission line;
a device connected to the transmission line for receiving the signal, the device including a blocking filter comprising:
a pulse generator for generating a masking pulse timed and of sufficient duration to block the reflection signal,
logic for combining the masking pulse with the signal received from the transmission line, wherein the reflection signal is blocked by the masking pulse, and
wherein the pulse generator comprises at least one memory element and a delay circuit, wherein an inverted output of the logic drives a set input of the at least one memory element, an output of the delay circuit drives a reset input of the at least one memory element, and an output of the at least one memory element is inverted and provided as input to the logic as the masking pulse.

6. The network of claim 5, wherein the device is connected closer to an input end of the transmission line than an output end of the transmission line, and wherein the blocking filter comprises a digital filter circuit disposed at an input of the device.

* * * * *